United States Patent
Wong et al.

(10) Patent No.: US 11,936,382 B2
(45) Date of Patent: Mar. 19, 2024

(54) ADAPTIVE OSCILLATOR FOR CLOCK GENERATION

(71) Applicants: ATI TECHNOLOGIES ULC, Markham (CA); ADVANCED MICRO DEVICES, INC., Santa Clara, CA (US)

(72) Inventors: Joyce Cheuk Wai Wong, Markham (CA); Dragoljub Ignjatovic, Markham (CA); Mikhail Rodionov, Markham (CA); Ljubisa Bajic, Markham (CA); Stephen V. Kosonocky, Fort Collins, CO (US); Steven J. Kommrusch, Fort Collins, CO (US)

(73) Assignees: Advanced Micro Devices, Inc., Santa Clara, CA (US); ATI TECHNOLOGIES ULC, Markham (CA)

( * ) Notice: Subject to any disclaimer, the term of this patent is extended or adjusted under 35 U.S.C. 154(b) by 0 days.

(21) Appl. No.: 16/454,596

(22) Filed: Jun. 27, 2019

(65) Prior Publication Data
US 2019/0319609 A1    Oct. 17, 2019

Related U.S. Application Data

(62) Division of application No. 15/390,397, filed on Dec. 23, 2016, now Pat. No. 10,382,014.

(51) Int. Cl.
*H03L 1/02*    (2006.01)
*H03K 3/012*   (2006.01)
(Continued)

(52) U.S. Cl.
CPC ............. *H03K 3/013* (2013.01); *H03K 3/012* (2013.01); *H03K 3/0231* (2013.01); *H03K 3/03* (2013.01);
(Continued)

(58) Field of Classification Search
CPC .... H03K 3/012; H03K 5/1508; H03K 5/1534; H03L 5/00; H03L 5/02; H03L 7/0997
See application file for complete search history.

(56) References Cited

U.S. PATENT DOCUMENTS 8,138,845 B1 *  3/2012 Zhang .................. H03B 5/1253
                                              331/117 FE
9,448,125 B2    9/2016 Singh et al.
                (Continued)

FOREIGN PATENT DOCUMENTS

JP    2014016285    1/2014

OTHER PUBLICATIONS

Konstadinidis et al.( "SPARC M7: A 20 nm 32-Core 64 MB L3 Cache Processor",IEEE Journal of Solid-State Circuits, IEEE, USA, vol. 51, No. 1, Jan. 1, 2016 (Jan. 1, 2016), pp. 79-91) (Year: 2016).*
(Continued)

*Primary Examiner* — Patrick C Chen

(57) ABSTRACT

An output clock frequency of an adaptive oscillator circuit changes in response to noise on an integrated circuit power supply line. The circuit features two identical delay lines which are separately connected to a regulated supply and a droopy supply. In response to noise on the droopy supply, the delay lines cause a change in the output clock frequency. The adaptive oscillator circuit slows down the output clock frequency when the droopy supply droops or falls below the regulated supply. The adaptive oscillator circuit clamps the output clock frequency at a level determined by the regulated supply when the droopy supply overshoots or swings above the regulated supply.

20 Claims, 9 Drawing Sheets

(51) Int. Cl.
| | |
|---|---|
| *H03K 3/013* | (2006.01) |
| *H03K 3/0231* | (2006.01) |
| *H03K 3/03* | (2006.01) |
| *H03K 5/15* | (2006.01) |
| *H03L 5/00* | (2006.01) |
| *H03L 7/085* | (2006.01) |
| *H03L 7/099* | (2006.01) |
| *H03K 5/1534* | (2006.01) |

(52) U.S. Cl.
CPC ......... *H03K 5/1506* (2013.01); *H03K 5/1508* (2013.01); *H03L 1/02* (2013.01); *H03L 5/00* (2013.01); *H03L 7/085* (2013.01); *H03L 7/0997* (2013.01); *H03K 5/1534* (2013.01)

(56) References Cited

U.S. PATENT DOCUMENTS

| | | | | |
|---|---|---|---|---|
| 2011/0221487 | A1* | 9/2011 | Lesso | H03L 7/087 327/147 |
| 2013/0249611 | A1* | 9/2013 | Vandepas | H03L 1/022 327/159 |
| 2014/0015615 | A1* | 1/2014 | Hekmat | H03L 7/099 331/2 |
| 2015/0365093 | A1* | 12/2015 | YangGong | H03L 7/0802 331/1 A |
| 2016/0218721 | A1* | 7/2016 | Herbeck | G06F 1/08 |

OTHER PUBLICATIONS

Yifan et al. (Asymmetric Frequency Locked Loop (AFLL) for adaptive clock generation in a 28nm SPARC M6 processor, IEEE Asian Solid-State Circuits Conference 2014) (Year: 2014).*

International Preliminary Report on Patentability dated Jul. 4, 2019 for International Application No. PCT/US2017/067612, 8 pages.
Extended European Search Report dated Jul. 16, 2020 for European Application No. 17884674.7, 8 pages.
Konstadinidis, Georgios K. et al., "SPARC M7: A 20 nm 32-Core 64 MB L3 Cache Processor", Journal of Solid-State Circuits, vol. 51, No. 1, Jan. 2016, 13 pages.
Gubbi, Sagar Venkatesha et al., "All Digital Energy Sensing for Minimum Energy Tracking", Very Large Scale Integration Systems (VLSI), vol. 23, No. 4, Apr. 2015, 5 pages.
First Office Action dated Apr. 10, 2020 for Chinese Patent Application No. 201780075306.5, 15 pages.
Second Office Action dated Apr. 10, 2020 for Chinese Patent Application No. 201780075306.5, 7 pages.
Translation of Non-final Office Action dated Aug. 3, 2021 for Japanese Application No. 2019-534193, 8 pages.
Examination Report dated Aug. 9, 2021 for Indian Application No. 201917024261, 7 pages.
Office Action issued in European Application No. 17884674.7, dated Jun. 11, 2021 5 pages.
Final Office Action dated Aug. 4, 2021 for Chinese Application No. 201780075306.5, 14 pages.
Translation of Korean Office Action dated Mar. 14, 2022 for Korean Application No. 10-2019-7016911, 14 pages.
Office Action issued in Japanese Application No. 2019-534193, dated Oct. 11, 2022, 23 Pages.
Konstandinidis et al. "SPARC M7: A 20 nm 32-Core 64 MB L3 Cache Processor," IEEE Journal of Solid-State Circuits, vol. 51(1): 2016, 16 Pages.
Notice of Allowance issued in Korean Application No. 10-2019-7016911, dated Aug. 17, 2022, 3 Pages.
Translation of Japanese Office Action dated Mar. 14, 2022 for Application No. 2019-534193, 17 pages.
Office Action issued in European Application No. 17884674.7, dated Dec. 9, 2022, 7 Pages.

* cited by examiner

ADAPTIVE OSCILLATOR FOR CLOCK GENERATION

CROSS-REFERENCE TO RELATED APPLICATIONS

The presentation application is a divisional application of U.S. patent application Ser. No. 15/390,397, entitled "Adaptive Oscillator for Clock Generation" and filed on Dec. 23, 2016, the entirety of which is incorporated by reference herein.

BACKGROUND

Description of the Related Art

A clock generator circuit needs to supply a stable clock signal that is stable to sequential components of an integrated circuit in order for the integrated circuit components to function correctly in accordance with their design. Clock generator circuits are typically oscillators which supply a system clock signal to components of an integrated circuit at a certain frequency.

The ability of a clock oscillator circuit to supply a stable input or system clock signal to an integrated circuit system may be affected by noise on the power supply line. Noise on a power supply line may cause the power supply voltage to vary from a certain reference voltage level. Noise may include, for example, without limitation, deterministic noise sources and random noise sources. Deterministic noise sources may include noise such as, without limitation, crosstalk between adjacent signal traces, electromagnetic interference radiation, substrate noise, multiple gate switching, and simultaneously switching gates. Random noise sources may include noise such as, without limitation, thermal noise associated with electron flow, shot noise due to potential barriers in semiconductors, flicker noise associated with crystal surface defects in semiconductors. Noise may cause the power supply voltage to fall below or droop below a desired reference voltage level. Alternatively, the noise on the power supply line may cause the power supply voltage to rise above or overshoot a desired reference voltage level. Noise on the power supply line may result in fluctuations or jitter on a system clock signal line that affects the stability and operation of the sequential components of an integrated circuit. Compensating for noise on the power supply line is typically a two-step process. In a first step, a system or circuit must first detect and indicate when there is noise on the power supply line. In a second step, in response to the indication of noise that causes a power supply droop, a signal must be generated to another circuit that will slow down the output system clock frequency as long as the noise exists. Another way a system may compensate for noise on the power supply voltage is by adding extra margin to the power supply voltage so that when there is fluctuation such as droop on the supply line, it is covered by the added margin and does not result in violation of clock circuit timing which may cause the functional timing of the chip to fail.

However, the two-step process tends to be slow. For example, first, a circuit has to detect noise on a voltage supply line which is sometimes very difficult to detect because noise, in some instances, may be so transient that it may last less than a nanosecond. A nanosecond is a short period of time for detection and notification. Additionally, adding margins to power supply voltage results in the integrated circuit burning significantly more power and an increase in power consumption of an integrated circuit results in a lack of energy efficiency.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
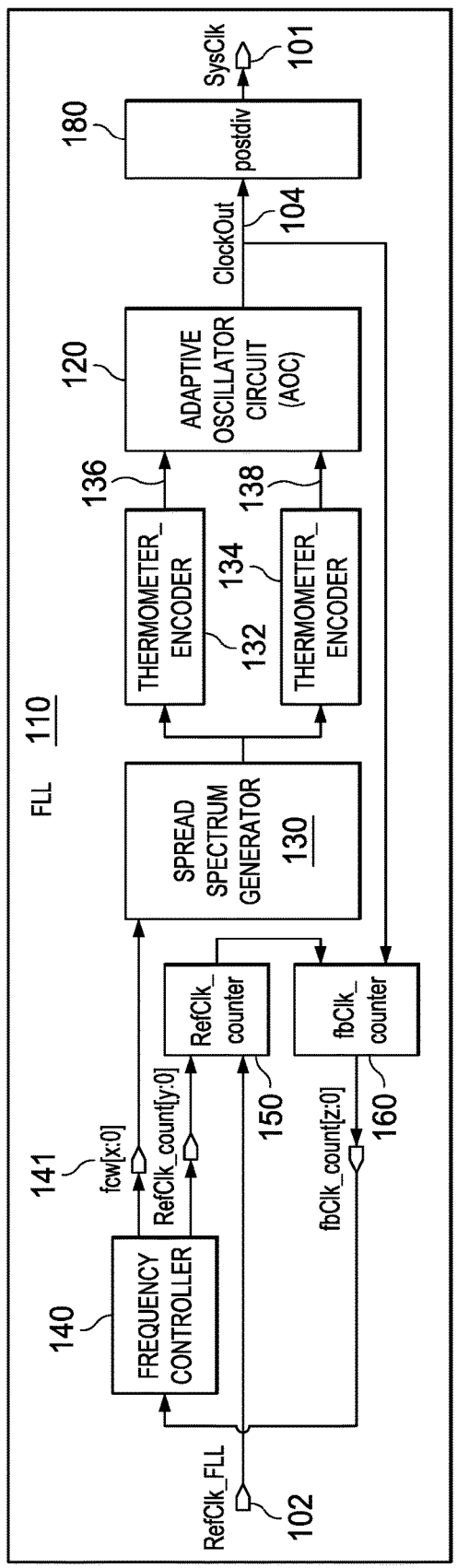
FIG. 1 is a block diagram of an illustrative clock generator system in which an Adaptive Oscillator Circuit may be implemented in accordance with an illustrative embodiment of the disclosure.

It should be understood at the outset that although an illustrative embodiment of one or more embodiments are provided below, the description is not to be considered as limiting the scope of the embodiments described herein. The disclosure may be implemented using any number of techniques, whether currently known or in existence. The disclosure should in no way be limited to the illustrative implementations, drawings, and techniques illustrated and described herein, which may be modified within the scope of the appended claims along with the full scope of equivalents. It should be appreciated that for simplicity and clarity of illustration, where considered appropriate, the reference numerals may be repeated among the figures to indicate corresponding or analogous elements.

The present disclosure provides for an adaptive oscillator circuit that automatically adjusts or adapts the frequency of its output clock in proportion to the noise on an input or core power supply line. The input or core power supply is the voltage supply that feeds the processor cores, the application specific integrated circuits, and any other component blocks on a chip. Noise on the core power supply affects delay time in a chip and also affects the maximum operational frequency of the chip. Noise on the core power supply line may be caused by, without limitation, noise, spikes in processing activity, simultaneous switching, ringing, and other such events which cause the input power supply line to droop or overshoot in relation to a target power supply voltage. The target power supply voltage is a supply voltage that is regulated or generated to be a certain voltage level. In this disclosure, the target power supply may also be referred to as the regulated supply. In this disclosure, the input or core power supply or input power supply line is also referred to as the droopy power supply or droopy power supply line. Noise on the droopy power supply may affect the time a signal takes to propagate from a source to a destination and may also affect the maximum operational frequency of the chip.

In the adaptive oscillator circuit, the frequency of the output clock that goes out to the system to enable clocking of the various components is directly related to the noise on the input power supply line. Sequential circuitry requires clock signals to have sufficient time margin so that they do not fail when the power supply line the circuitry is connected to has noise that affects the propagation delay signal. The frequency tracks or follows the power supply voltage swings, such as, for example, the voltage droops or voltage overshoots, similar to that of the function of a ring oscillator where the frequency follows the power supply voltage. For example, noise on the input power supply line may cause the power supply voltage to droop below the regulated supply voltage level. In response to the droop in voltage, the Adaptive Oscillator Circuit modulates the frequency of the output clock or the time period within which the output system clock changes. Specifically, the output clock frequency is automatically reduced for the duration of the droop to provide more time for sequential circuitry on a chip to complete its function. Conversely, noise on the input power supply line may cause the power supply voltage to overshoot the regulated supply voltage level. In response to the overshoot, the adaptive oscillator circuit clamps the output clock frequency to a target maximum system clock frequency.

Turning first to FIG. 1, a block diagram of a clock generator system 100 in which an adaptive oscillator circuit may be implemented is illustrated in accordance with illustrative embodiments of the disclosure. In system 100, a Frequency Lock Loop (FLL) 110 inputs a reference clock, RefClk_FLL 102, for the RefClk_counter 150, and outputs a system clock, SysClk 101. The FLL 110 may serve as the clock generator for a system-on-chip and the output system clock, SysClk 101, is the output oscillator clock that drives the clock tree within the system-on-chip. Turning now to an overview of the FLL 110, a reference clock counter, RefClk_counter 150, counts a number of reference clock cycles within a specified period. A feedback clock counter, fbClk counter 160, counts a number of the adaptive oscillator circuit (AOC) 120 clock cycles within a specified period. Frequency controller 140 compares the reference clock count number and the feedback clock counter number and generates the difference in the form of frequency control word, fcw[x:0] 141.

The frequency controller 140 closes the frequency loop in the FLL 110. In one embodiment, frequency controller 140 may contain a Proportional-Integral (PI) controller. In another embodiment, Frequency controller 140 may contain a Proportional-Integral-Differential (PID) controller. The frequency control word, fcw[x:0] 141 may be modulated by the spread-spectrum generator 130 and converted into thermometer code data control signal 136 and thermometer code data control signal 138 by the thermometer encoders 132 and 134. The adaptive oscillator circuit 120 inputs thermometer code data control signals 136, 138 to control a reference delay line (not shown) and a droopy delay line (not shown) in the AOC. The thermometer code data control signals may contain information that may set delay bits or delay offsets in the AOC 120.

The FLL 110 and the adaptive oscillator circuit 120 are powered by a droopy power supply (not shown) and a reference voltage (not shown). The AOC 120 generates an output clock, Clockout 104, with a frequency that is determined by the droopy power supply or the reference power supply. In some embodiments, the FLL 110 may include a post-divider 180 for output frequency post-division of the output clock ClockOut 104 to generate system clock SysClk 101. It must be noted that the AOC 120 is not limited to use in the illustrated system 100 and may be used in other systems that have power supply changes that affect critical paths in a synchronous design.

The illustration of the AOC 120 in the FLL 110 of system 100 is not meant to imply physical or architectural limitations to the manner in which different advantageous embodiments may be implemented. Other components in addition and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 2:
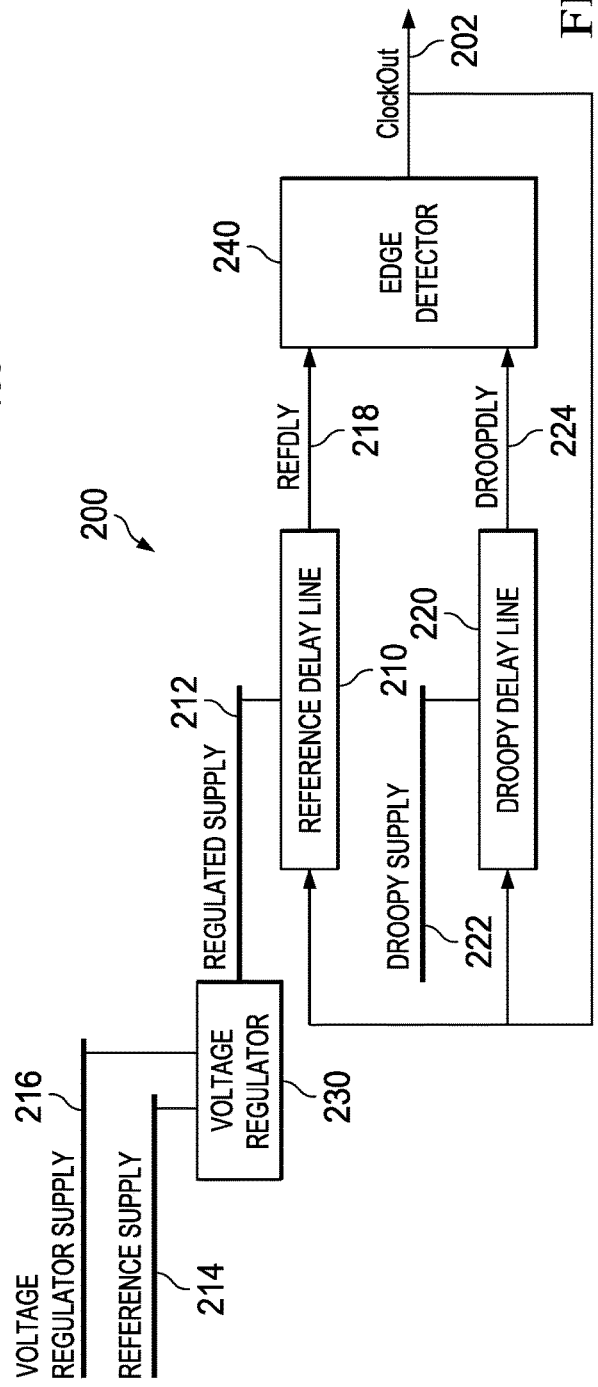
FIG. 2 illustrates a detailed block diagram of the architecture of the Adaptive Oscillator Circuit illustrated in FIG. 1 according to an illustrative embodiment of the disclosure.

FIG. 2 illustrates a diagram 200 of the architecture of the Adaptive Oscillator Circuit (AOC) 120 illustrated in FIG. 1, according to an illustrative embodiment of the disclosure. The AOC 120 may function as a delay line based oscillator. A delay line based oscillator may include, for example, without limitation, a ring oscillator, a digitally controller oscillator, or the like. In one or more illustrative embodiments of this disclosure, the AOC 120 produces an output in a manner that is similar to that of a ring oscillator.

A ring oscillator connects a chain of delay stages together in a closed loop. The output of each stage is used as input for the next one and the output from the last stage is fed back to the first stage. Each stage has a certain propagation delay or a time for a signal to pass from input of a stage to the output of the same stage. Because of the delay of each stage, the whole circuit spontaneously starts oscillating at a certain frequency. The frequency depends on the number of stages and the delay through each stage. For a ring oscillator to start oscillating, the resulting logical function of the chain of delay stages must show a logic inversion function so that when a signal travels from the input of the first stage to the output of the last stage, a signal polarity change occurs. A polarity change means logic "1" becomes logic "0" and/or logic "0" becomes logic "1". It must be noted that, in the illustrative example of FIG. 2, the last stage in the ring oscillation chain is the edge detector 240. The output clock of edge detector 240 feeds back and is input simultaneously to the first stage of the AOC 120 which include the first cells or components (not shown) in both the reference delay line 210 and the droopy delay line 220.

In FIG. 2, the AOC 120 is illustrated as including two delay lines. The two delay lines may be identical to each other with respect to the number and type of internal delay components. The internal components may include, but are in no way limited to, buffers, inverters, or other type of non-sequential elements. The number of delay components in the delay lines may vary. For example, increasing the number of delay elements may reduce the maximum oscillation frequency of the output clock.

Each delay line is powered by a separate power supply connection. The power supply connection to each delay line determines the propagation delay, or the time it takes for a signal to propagate through each respective delay line. In one embodiment, the propagation delay through the first delay line and the second delay line may be the same. In another embodiment, the propagation delay through the first delay line and the second delay line may be different.

Turning first to the power supply connections of a first delay line, reference delay line 210, as illustrated in diagram 200, voltage regulator 230 generates a constant or steady voltage, regulated supply 212, within acceptable or nominal limits. The acceptable or nominal limits are based on a reference supply 214 that may be generated on chip or off-chip, and is set to a certain level that may be higher or lower than the core power supply voltage. One input to the voltage regulator 230 is the voltage regulator supply 216 which is the operational power supply of voltage regulator 230 In some embodiments, the voltage regulator 230 may include a filter, such as, without limitation, a low-pass filter, to smooth out any noise transients for the reference supply 214 to obtain the regulated supply 212. In one embodiment, the reference supply 214 may be the core power supply. In another embodiment, the core power supply may also correspond to droopy supply 222. Reference delay line 210 is connected to the regulated supply 212 that is generated from voltage detector 230. Reference delay line 210 generates a delayed signal, RefDly 218, as one input to edge detector 240.

In some illustrative embodiments, the reference supply 214 has no noise or variation and may be directly connected to the reference delay line 210 instead of the regulated supply 212 which is output of voltage regulator 230. The regulated supply 212 provides a comparison or reference point to determine how far outside the target power supply voltage the droopy supply 222 may swing based on the noise. The target power supply voltage is the standard operating voltage of a system or circuit that excludes any variations or fluctuations.

Turning next to the power supply voltage connections of the second delay line, droopy delay line 220, Droopy supply 222 connects to droopy delay line 220. The droopy supply 222 may be the input or core power supply that supplies the operating voltage for all the components on a system-on-chip. The droopy delay line 220 generates a delayed signal, DroopDly 224 as another input to edge detector 240.

Turning now to the operation of the edge detector 240 of adaptive oscillator circuit 200, edge detector 240 inputs two signals. One input signal to edge detector 240 is the delayed signal, RefDly 218, that is output from reference delay line 210. A second input signal to edge detector 240 is the delayed signal, DroopDly 224, that is output from droopy delay line 220. Edge detector 240 generates output clock, ClockOut 202. The output clock, ClockOut 202, may be output to the system of the AOC. ClockOut 202 also has a feedback path to the inputs of both reference delay line 210 and droopy delay line 220. ClockOut 202 propagates by way of the feedback path to both the reference delay line 210 and the droopy delay line 220 at the same time. It must be noted that changes in polarity may also be implemented inside reference delay line 210 and the droopy delay line 220.

Edge detector 240 toggles its output ClockOut 202 only when both of its inputs are of the same polarity. For example, when both RefDly 218 and DroopDly 224 are at the same polarity of logic zero "0" or logic one"1", the output ClockOut 202 toggles or changes polarity. A change in polarity is said to occur when a signal changes from a first defined state to a different second defined state, for example, without limitation, from 0 to 1. The logical operation of edge detector 240 is shown in Table 1.

TABLE 1

| Edge Detector Logical Operation | | |
|---|---|---|
| RefDly | DroopDly | ClockOut |
| 0 | 0 | Toggle |
| 0 | 1 | No change; Retain current polarity |
| 1 | 0 | No change; Retain current polarity |
| 1 | 1 | Toggle |

Edge detector 240 may be implemented by one or more components that operate in accordance with the edge detector logical operation shown in Table 1. In one or more illustrative embodiments of this disclosure, the edge detector 240 may be implemented by a Muller C-element. In operation, the output of the Muller C-element toggles on the edge of the latest arriving signal of the same polarity.

The output of the edge detector 240, ClockOut 202, may be output to generate a system clock and feeds back to the input stage of reference delay line 210 and the input stage of droopy delay line 220 based on the ring oscillator architecture of the AOC. The time it takes for ClockOut 202 to propagate through reference delay line 210 and droopy delay line 220 and affect the output of edge detector 240 depends on the input power supply voltage that connects to each respective delay line. More specifically, in operation, ClockOut 202 toggles in accordance with the delayed signal that has the greater propagation delay or is the slower of the two delayed signals between RefDly 218 and DroopDly 224. Edge detector generates a ClockOut 202 that has a slower frequency when there is noise that causes droop on droopy delay line 220. In sum, frequency of the output system clock, ClockOut 202, is determined by the reference delay line 210 or the droopy delay line 220.

Figure 3:
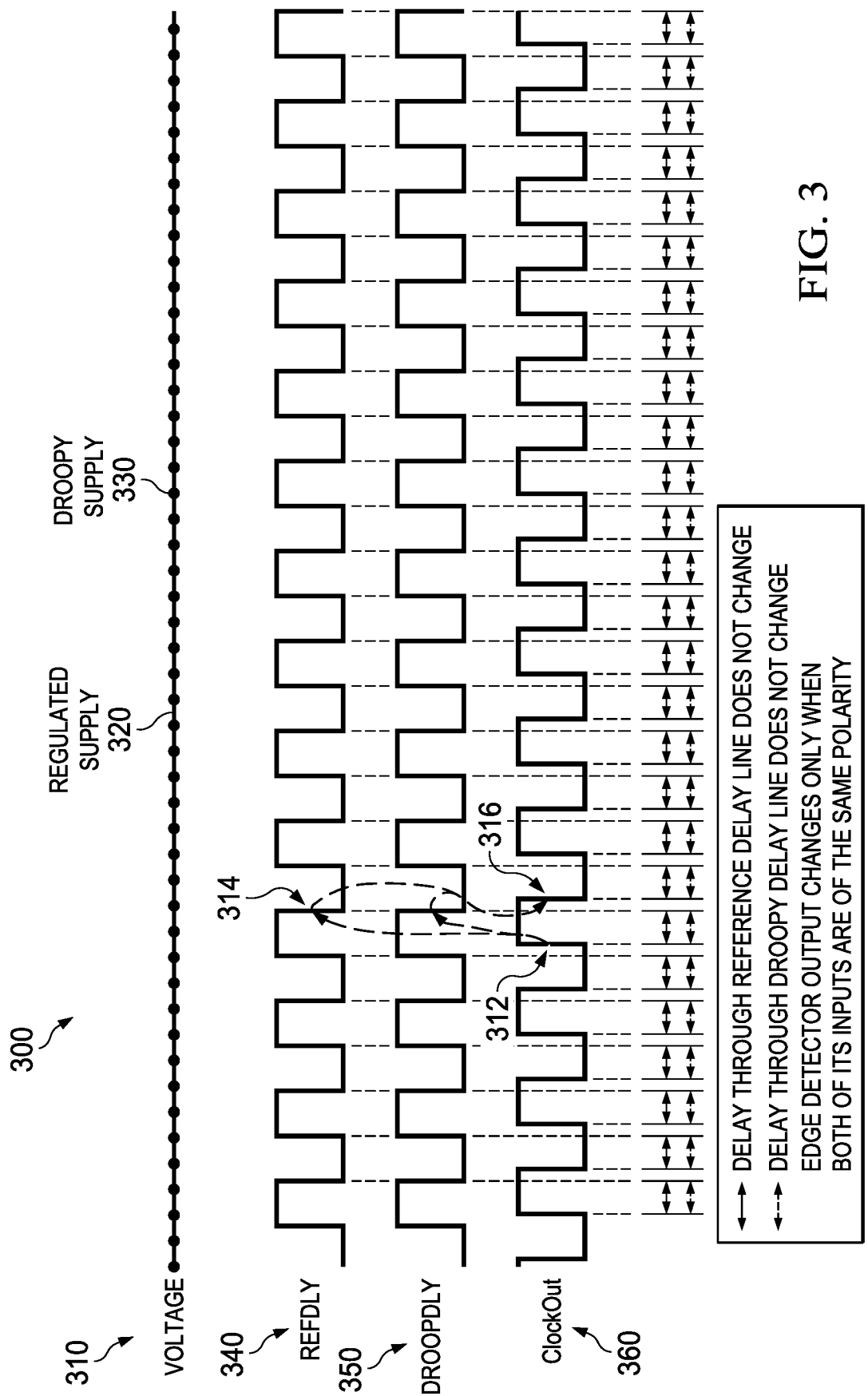
FIG. 3 is an illustrative embodiment of a general timing diagram of the operation of the Adaptive Oscillator Circuit of FIG. 2 in accordance with an illustrative embodiment of the disclosure.

Turning now to FIG. 3, an illustrative embodiment of a general timing diagram 300 of the operation of the adaptive oscillator circuit is illustrated according to an illustrative embodiment of the disclosure. In the depicted example, the timing diagram 300 is an example of one implementation for adaptive oscillator circuit 200 in FIG. 2.

As illustrated, on the voltage axis 310, the regulated supply voltage 320 and the droopy supply voltage 330 are at a same voltage. ClockOut 360 is the output clock signal from edge detector 240. As depicted, when regulated supply 320 and droopy supply 330 are at a same voltage level on voltage axis 310, reference delay line 210 and droopy delay line 220 take the same amount of time to propagate ClockOut 360 as shown at 312 and change the polarity of RefDly 340 and DroopDly 350 as shown at 314. Based on the logical operation of edge detector 240, ClockOut 360 would toggle immediately as illustrated at 316.

Figure 4:
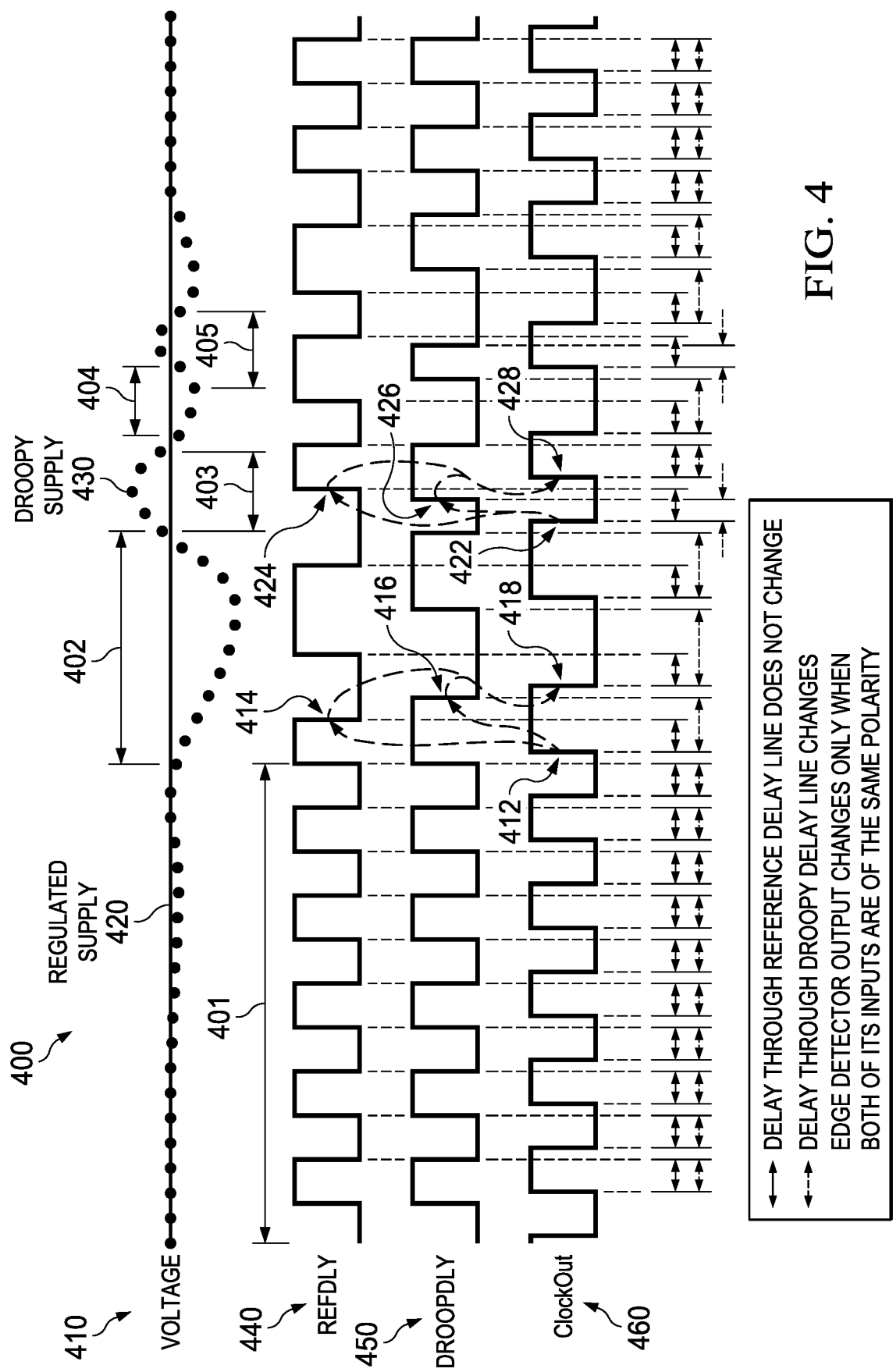
FIG. 4 illustrates a timing diagram of the operation of the Adaptive Oscillator Circuit of FIG. 2 in accordance with an illustrative embodiment of the disclosure.

FIG. 4 is an illustrative embodiment of a timing diagram 400 of the operation of the adaptive oscillator circuit 200. In the illustrative example, timing diagram 400 is an example of one implementation of the operation of the adaptive oscillator architecture in FIG. 2.

As depicted in the example, the droopy supply voltage level 430 is shown in relation to the regulated supply voltage level 420 on input voltage line 410. The regulated supply voltage 420 remains relatively constant at a fixed level of voltage 410.

As depicted, during a time period 401, the droopy supply 430 is relatively constant at the level of regulated supply 420 on voltage line 410. When regulated supply 420 and droopy supply 430 are at the same voltage level, RefDly 440 and DroopDly 450 change polarity at the same time. ClockOut 460 toggles immediately when RefDly 440 and DroopDly 450 are of the same polarity.

During a time period 402 and again at a time period 404, droopy supply 430 droops or swings lower than the regulated supply 420. The droop may be caused by noise or some other circuit disturbance. The lowered voltage level of droopy supply 430 relative to the regulated supply 420 causes the propagation delay of ClockOut 460 at 412 through droopy delay line 220 to 416 to be longer than the propagation delay of ClockOut 460 at 412 through reference delay line 210 to 414. This may cause DroopDly 450 to toggle at a later time than RefDly 440 as depicted at 416. Therefore, as shown at 418, ClockOut 460, will follow the change in polarity of DroopDly 450. The delay in toggling DroopDly 450 is equivalent to stretching the period of ClockOut 460.

During a time period 403 and again at time period 405, the droopy supply 430 overshoots or swings higher than the regulated supply 420. As a result, the time it takes for ClockOut 460 at 422 to propagate through droopy delay line 220 to DroopDly 450 at 426 is faster than the time it takes for ClockOut 460 to propagate through reference delay line 210 to RefDly 440 at 424. Nevertheless, the period of ClockOut toggles at 428 at rate based on the slower propagation delay of RefDly 440.

In summary, in the illustrative timing examples of FIG. 3 and FIG. 4, the clock period and frequency of ClockOut 460 of the Adaptive Oscillator 200 depicted in FIG. 2 are determined by the delay line that has the slower propagation delay based on their respective voltage level. In an ideal operation where the voltage level of the regulated supply 420 and the droopy supply 430 are the same, the propagation time through the reference delay line and the droopy delay line are the same. In illustrative embodiments of this disclosure where noise is present on the droopy supply 430 which causes droops relative to the regulated supply 420, the propagation time through the droopy delay line 220 is slower than that of the propagation time through the reference delay line 210. In such cases, the slower delay through droopy delay line 220 will determine the output period of ClockOut 460. In illustrative embodiments of this disclosure where noise is present on the droopy supply 430 which causes overshoots relative to the regulated supply 420, the propagation time through the droopy delay line 220 is faster than that of the propagation time through the reference delay line 210. In such cases, the slower delay through the reference delay line 210 determines the output period of ClockOut 460.

More specifically, in operation, FIG. 4, at times 402 and 404, illustrates noise on the droopy supply 430 that may cause the droopy supply voltage level to droop below the regulated supply 420. The lower voltage may cause the time ClockOut 460 to propagate through the droopy delay line to DroopDly 450 to be longer than the time ClockOut 460 needs to propagate through the reference delay line to RefDly 440. The period of ClockOut 460 remains stretched during time 402 for as long as droop exists on the droopy supply 430. The resulting frequency of ClockOut 460 will therefore be determined by the droopy supply 430.

In addition, FIG. 4, at times 403 and 405, illustrates noise on the droopy supply 430 that may cause the droopy supply voltage level to swing above or overshoot the regulated supply 420. As a result, the time it may take for ClockOut 460 to propagate through the droopy delay line to DroopDly 450 may be faster than the propagation time through the reference delay line to RefDly 440. In this case, the time period or frequency of the output clock, ClockOut 460 is determined by RefDly 440 which has the slower propagation delay.

Figure 5:
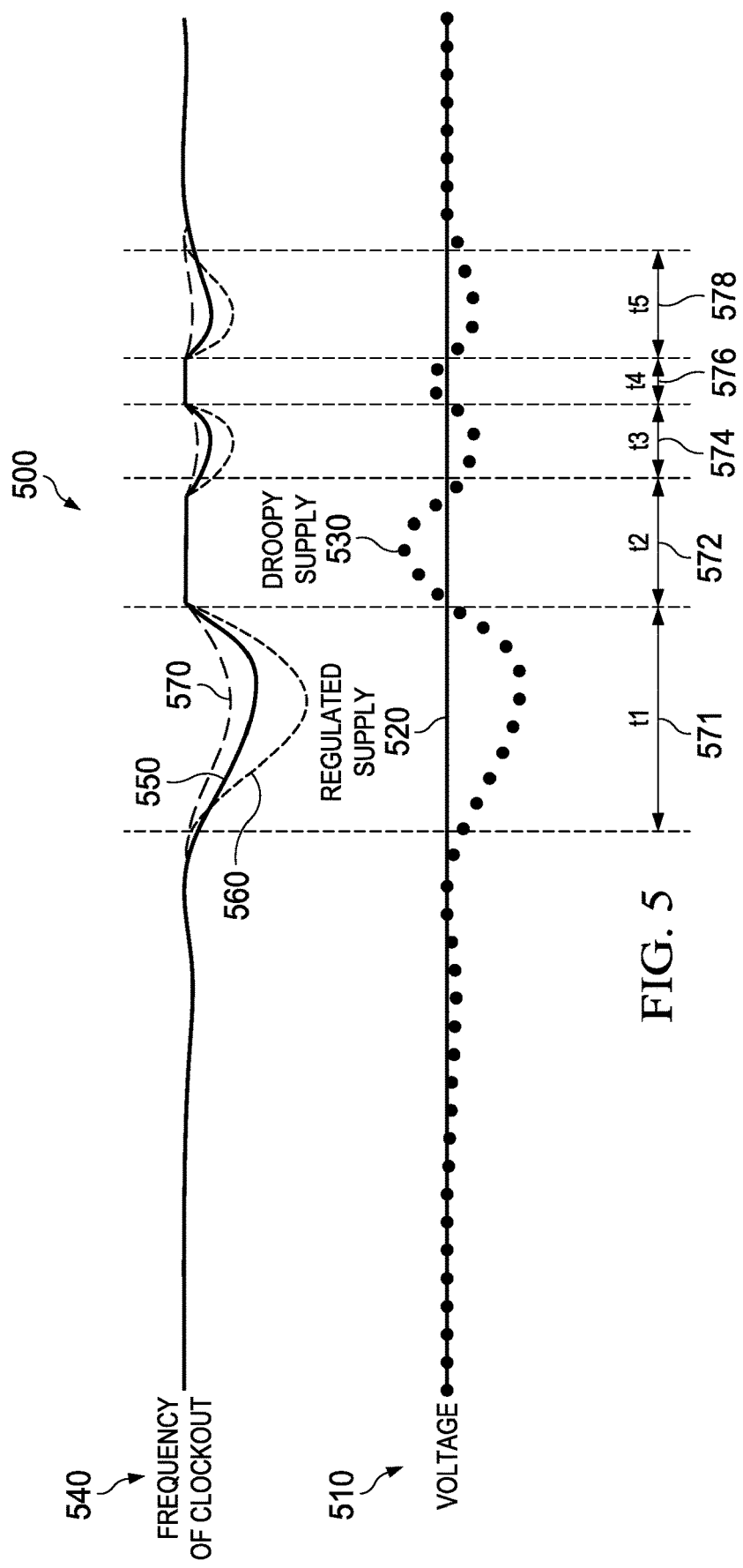
FIG. 5 illustrates a diagram of the change in frequency of the output clock of the Adaptive Oscillator Circuit relative to the change in voltage in accordance with an illustrative embodiment of the disclosure.

FIG. 5 illustrates a diagram 500 of the change in frequency of the output clock of the Adaptive Oscillator Circuit relative to the change in voltage in accordance with an illustrative embodiment of the disclosure. In the illustrative example, the Frequency of Clockout axis 540 illustrates the change in frequency relative to change in voltage as illustrated on the Voltage axis 510. In general, it must be noted that a frequency on the Frequency of ClockOut axis 540 tracks the droopy supply on the Voltage axis 510. In the depicted example, frequency 550 decreases when the droopy supply voltage decreases. In an alternative embodiment, frequency 560 and 570 illustrate frequencies that also decrease as the droopy supply voltage decreases but the level of frequency decrease for frequency 560 and 570 may be adjustable or programmable.

In the illustrative example, during a time t1 571, and again at a time t3 574 and t5 578, droopy supply 530 droops below regulated supply 520. The frequency 550 of ClockOut from the AOC will slow down as it tracks the droopy supply 530.

Programmable frequencies 560 and 570 will similarly track the droopy supply 530 decrease but at a predetermined programmed level. In the illustrative example, during a time t2 572 and again at a time t4 576, droopy supply 530 overshoots the regulated supply 520. In cases of overshoot, frequency 550 on the frequency of clockout axis 540 clamps at a level based on the regulated supply 520 as shown during the t2 572 and t4 576 time periods. Similarly, programmable frequencies 560 and 570 also clamp at a level based on the regulated supply during a time period where the droopy supply 530 overshoots the regulated supply 520.

Figure 6:
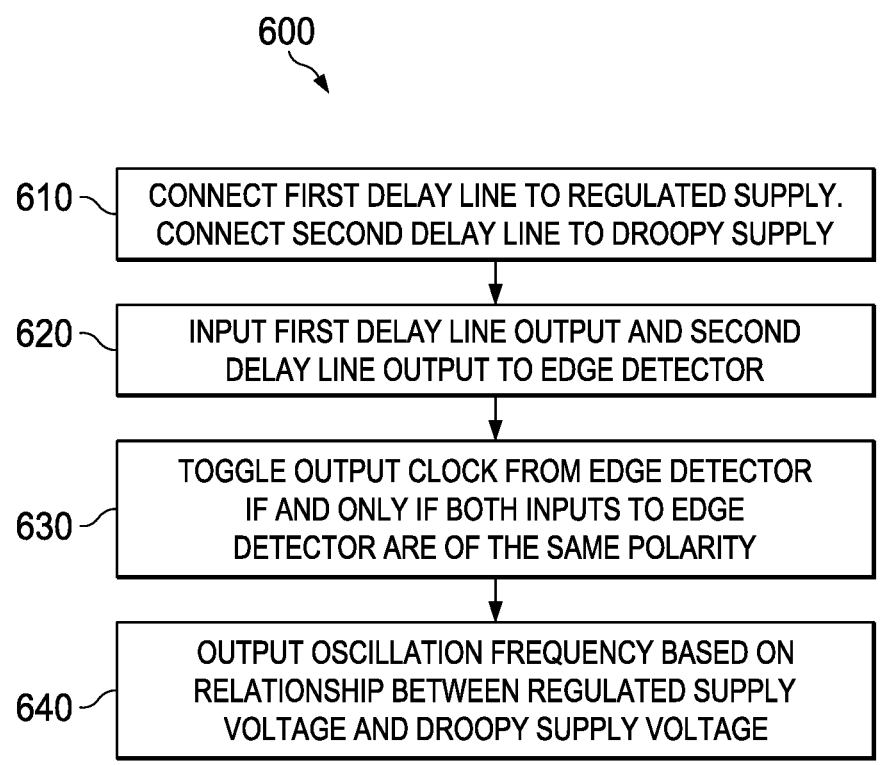
FIG. 6 illustrates a flowchart of the general operation of the Adaptive Oscillator Circuit in accordance with an illustrative embodiment of the disclosure.

Turning now to FIG. 6, a flowchart 600 is illustrated of the operation of the adaptive oscillator circuit according to an illustrative embodiment of the disclosure. At block 610, the operating conditions are established wherein a first delay line is connected to a regulated supply and a second delay line is connected to a droopy supply. At a block 620, the output from the first delay line and the output from the second delay line is input to an edge detector. At block 630, the edge detector toggles the output clock if an only if both inputs to the edge detector from the first delay line and the second delay line are of the same polarity. At a block 640, the output frequency of the clock from the edge detector is determined based on the relationship between the regulated supply voltage and the droopy supply voltage. The output clock is output to the system and also feeds back to the input stages of the first delay line and the second delay line.

Figure 7:
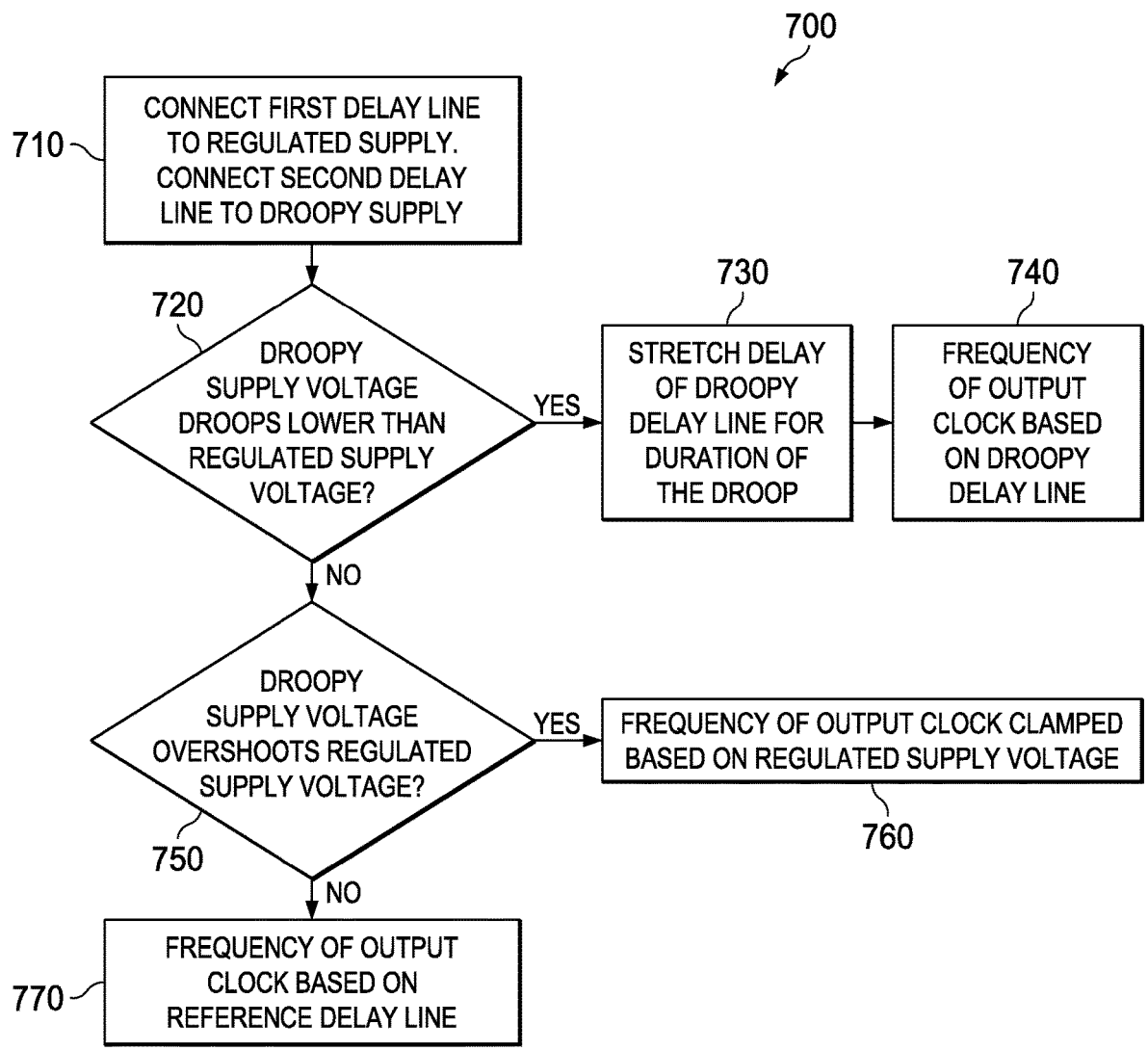
FIG. 7 illustrates a detailed flowchart of the operation of the Adaptive Oscillator Circuit in accordance with an illustrative embodiment of the disclosure.

FIG. 7 illustrates a detailed flowchart 700 of the operation of the adaptive oscillator circuit according to an illustrative embodiment of the disclosure. At block 710, a first delay line is connected to a regulated supply and a second delay line is connected to a droopy supply. At a block 720, it is determined whether the droopy supply voltage droops lower than the regulated supply voltage. In response to a determination that the droopy supply voltage is lower than the regulated supply voltage, at a block 730, the delay of the droopy delay line is stretched for the duration of the droop. At a block 740, the frequency of the output clock, ClockOut, is based on the droopy delay line. In response to a determination at a block 720 that the droopy supply voltage does not droop below the regulated supply voltage, it is determined at a block 750 whether droopy supply voltage overshoots the regulated supply voltage. In response to a determination that the droopy supply voltage overshoots the regulated supply voltage, at a block 760, the frequency of the output clock is clamped based on the regulated supply voltage. At a block 770, in response to a determination that the droopy supply voltage is not higher than the regulated supply voltage, the output frequency of the system clock is based on the regulated supply.

Figure 8:
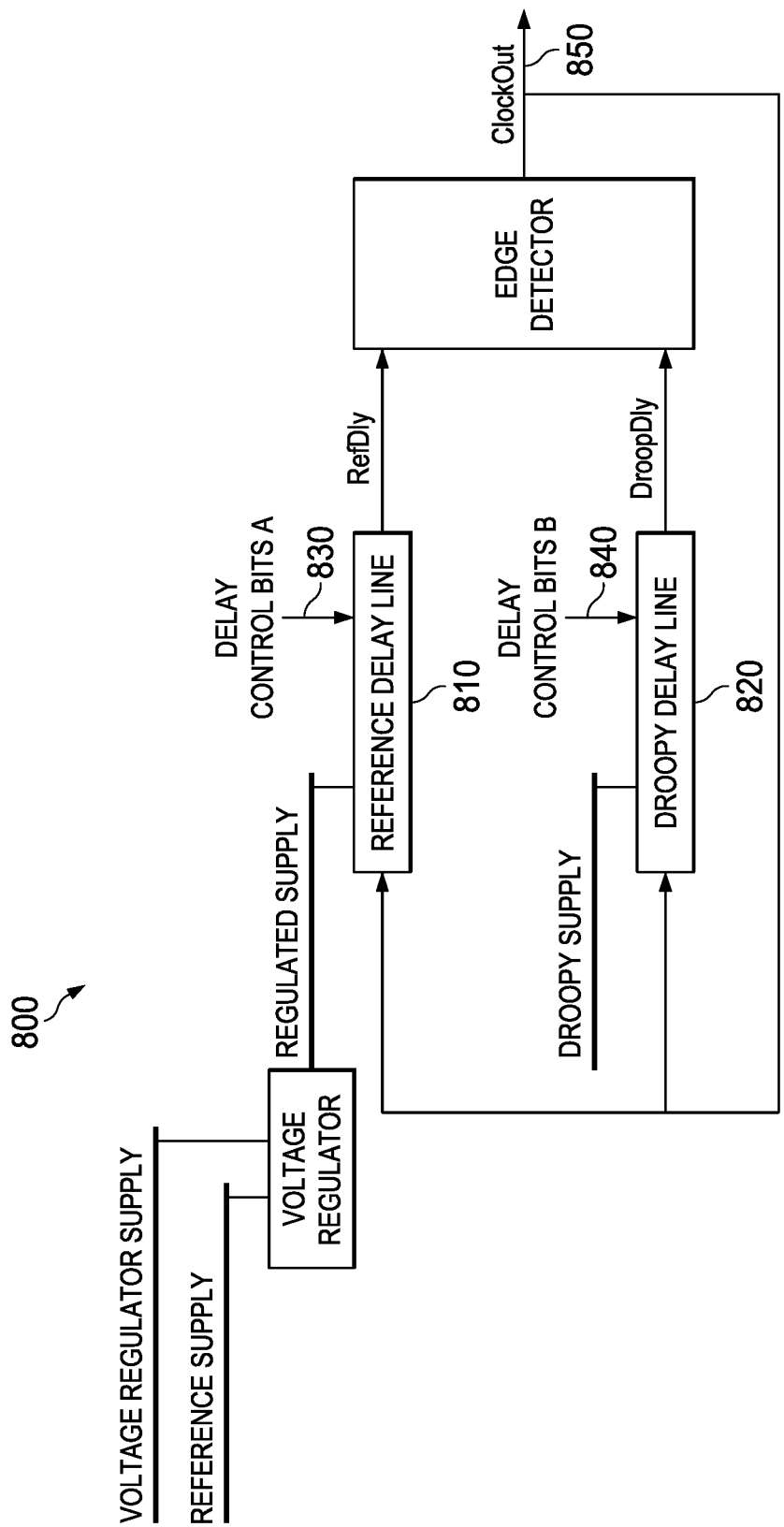
FIG. 8 illustrates an embodiment of the frequency control of the Adaptive Oscillator Circuit in accordance with the illustrative embodiment of the disclosure.

FIG. 8 illustrates an embodiment of the control of the adaptive oscillator circuit 800 in accordance with an illustrative embodiment of the disclosure. In the illustrative example, reference delay line 810 and droopy delay line 820 are identical to each other. One or more delay control bits 830 and 840 may be used to control the propagation delay through each delay line. The delay control bits may come from a controller in the same system as the adaptive oscillator circuit 800. In an illustrative embodiment of the disclosure, delay control bits 830 and 840 may be set by the frequency control word, fcw[x:0] 141 of FIG. 1. In one embodiment, the values of the delay control bits 830 and 840 may be the same. In another embodiment, the values of the delay control bits 830 and 840 may be different. When the delay control bits 830 and 840 are the same, the propagation delay through the reference delay line 810 and the droopy delay line 820 is the same and the frequency of the output clock, ClockOut 850, is determined by the slower delay of the reference delay line 810 or the droopy delay line 820.

When the delay control bits 830 and 840 are different, the propagation delay through the reference delay line 810 and the droopy delay line 820 are different. However, the delay control bits 830 and 840 may be adjusted so the propagation delay of the droopy delay line 820 remains within a threshold that controls the overshoot of the adaptive oscillator circuit output clock frequency.

Figure 9:
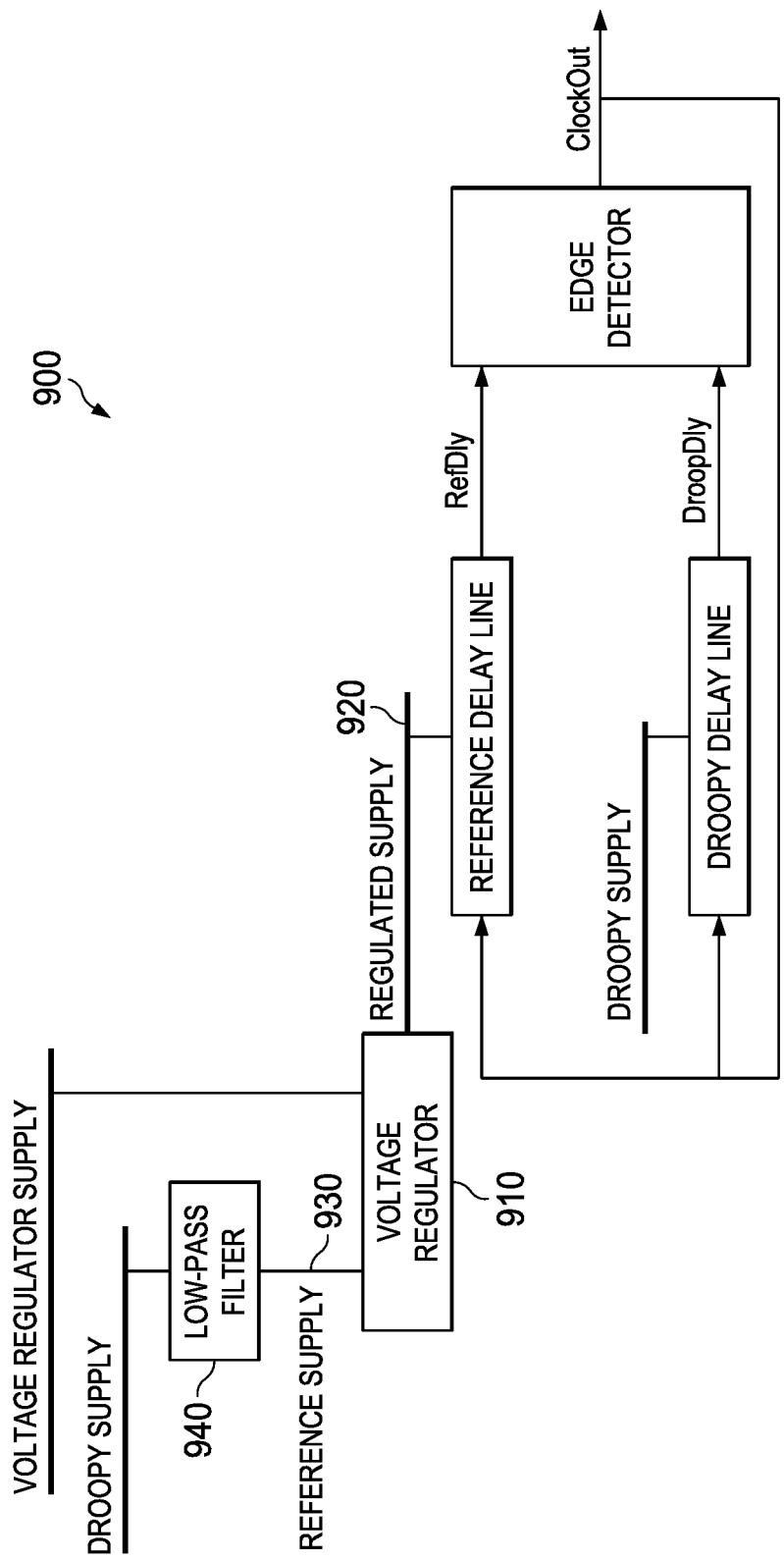
FIG. 9 illustrates a detailed view of the reference supply voltage implementation in accordance with an illustrative embodiment of the disclosure.

FIG. 9 illustrates a detailed view of the reference supply voltage implementation 900 in accordance with an illustrative embodiment of the disclosure. As depicted, voltage regulator 910 outputs a regulated supply 920. The voltage level of the regulated supply 920 is maintained at a same level as the reference supply 930 by operation of the voltage regulator 910. It must be noted that the voltage level of the regulated supply 920 should be as stable as possible with minimal variation on the supply line. The reference supply voltage may be a cleaner version of the droopy supply which may be the core power supply that powers all the chip components or some other input voltage. In some embodiments, the voltage regulator may include a low pass filter 940 to remove any noise on the droopy supply voltage line.

Figure 10:
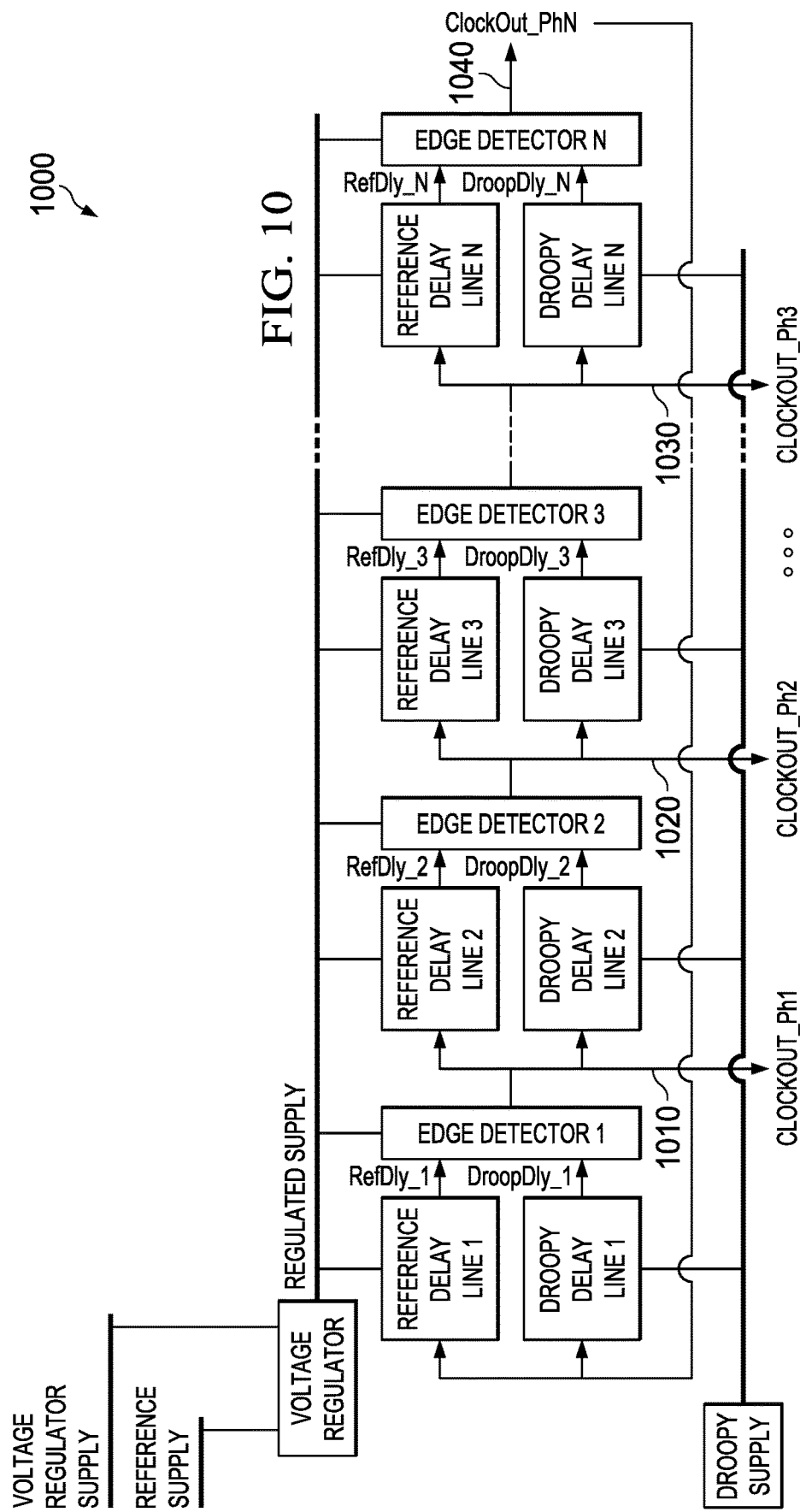
FIG. 10 illustrates a multistage implementation of the Adaptive Oscillator Circuit in accordance with an illustrative embodiment of the disclosure.

FIG. 10 illustrates a multistage implementation 1000 of the adaptive oscillator circuits in accordance with an illustrative embodiment of the disclosure. In the illustrative embodiment of FIG. 10, a number of AOC blocks may be connected together as in a ring oscillator format to generate a number of multiphase clocks. Each AOC block may be considered as a stage that outputs a clock of a particular phase. Each stage of the ring of AOC blocks may output a clock of a certain phase which also is input to the next stage in the ring. The output clock of the last stage in the ring, ClockOut_PhN 1040, feeds back to the inputs of the first stage in the ring. It must be noted that a logic inversion function must be maintained in this ring format. In the depicted example, ClockOut phase outputs depicted as ClockOut_Ph1 1010, ClockOut_Ph2 1020, ClockOut_Ph3 1030, and ClockOut_PhN 1040 represent multiphase clock outputs having a fixed timing relationship between each ClockOut phase output. The clockout phase outputs may be used in the system for components that require multiple clock phases such as, without limitation, a fractional divider.

The illustrations of FIGS. 8-10 are not meant to imply physical or architectural limitations to the manner in which different advantageous embodiments may be implemented. Other components in addition and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

In some embodiments, the apparatus and techniques described above are implemented in a system comprising one or more integrated circuit (IC) devices (also referred to as integrated circuit packages or microchips), such as the Frequency Lock Loop described above with reference to FIGS. 1-4. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below.

In an embodiment, the delay lines of the adaptive oscillator circuit may include one or more buffers, such as, without limitation, programmable buffers connected in parallel. Another variation of the embodiment may include an array of buffers, such as, without limitation, tristate inverters, connected in parallel at each stage of a plurality of stages of the delay line. Each stage would include an edge detector that may output a clock of certain phase. In another embodiment, the delay lines may include load capacitors that may be adjusted to alter the sensitivity or the amount of change of delay as a function of fluctuations or variations of the droopy supply.

In yet another embodiment, connecting the Edge Detector to either the Regulated Supply or the Droopy Supply determines the sensitivity of the output clock frequency of the AOC to noise on the Droopy Supply line. In an illustrative example where the Edge Detector is connected to the Regulated Supply, the propagation delay through the Edge Detector remains stable because the Regulated Supply voltage level is stable. The Droopy Supply line may droop below the Regulated Supply Line and cause the propagation delay of the Droopy Delay Line to change and affect the period and frequency of the output clock of the AOC. The Droopy Delay Line may overshoot the Regulated Supply Line and cause the propagation delay through both the Reference Delay Line and the Edge Detector to remain the same and result in a clamp of the output clock frequency of the AOC. In another illustrative example where the Edge Detector is connected to the Droopy Supply, the Droopy Supply line may droop below the Regulated Supply line due to noise. This may cause an increase in the propagation delay through the Droopy Delay Line and the Edge detector, thereby increasing the frequency of the output clock of the AOC. Conversely, in this illustrative example, if the Droopy Supply Line overshoots the Regulated Supply Line because of noise, the propagation delay of the Reference Delay Line will not change, but the propagation delay of the Edge Detector will decrease and result in a frequency overshoot of the output clock of the AOC instead of the frequency being clamped.

Accordingly, the specification and figures are to be regarded in an illustrative rather than a restrictive sense, and all such modifications are intended to be included within the scope of the present disclosure.

In summary, the AOC functions like a ring oscillator and outputs a clock whose frequency is automatically adjusted in proportion to its propagation delay changes that are due to power supply voltage fluctuations. The purpose of the AOC is to temporarily slow down a clock when noise exists so as to maintain timing margins on a chip and prevent circuit failure. The adaptive oscillator circuit works directly with the droopy power supply that may be fluctuating because of noise and automatically slows down the clock frequency for the duration of the noise that causes droop. The clock frequency automatically modulates down in response to the noise that causes droop on the droopy supply line but is clamped to a frequency determined by a regulated supply in cases where the noise results in a voltage overshoot on the droopy supply that exceeds the regulated supply.

Benefits, other advantages, and solutions to problems have been described above with regards to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
generating a first delayed signal based on a regulated supply voltage and an output clock at a first delay line of an oscillator circuit;
generating a second delayed signal based on a droopy supply voltage and the output clock at a second delay line of the oscillator circuit, wherein the second delay line has a same number and type of components as the first delay line;
controlling a propagation delay of at least one of the first delayed signal and the second delayed signal based on a comparison between a number of reference clock cycles counted within a specified period and a number of clock cycles of the output clock counted within the specified period; and
sending the first delayed signal and the second delayed signal to an edge detector of the oscillator circuit, wherein the edge detector generates the output clock, and wherein a resulting oscillation frequency of the output clock is based on a relationship between the regulated supply voltage and the droopy supply voltage.

2. The method of claim 1, wherein the output clock toggles at an output frequency based on the first delayed signal in response to the droopy supply voltage being greater than the regulated supply voltage.

3. The method of claim 1, wherein the output clock toggles at an output frequency based on the second delayed signal in response to the droopy supply voltage being lower than the regulated supply voltage.

4. The method of claim 1, wherein controlling the propagation delay comprises:
inputting delay control bits to the first delay line and the second delay line to control the propagation delay of the at least one of the first delayed signal and the second delayed signal.

5. The method of claim 4, wherein a value of the delay control bits to the first delay line is equal to a value of the delay control bits to the second delay line.

6. The method of claim 4, wherein a value of the delay control bits to the first delay line is different from a value of the delay control bits to the second delay line.

7. The method of claim 4, further comprising:
performing, by a frequency controller, the comparison between a reference clock count number that indicates the number of reference clock cycles counted within the specified period and a feedback clock counter number that indicates the number of clock cycles of the output clock counted within the specified period and generating a difference as a frequency control word; and
wherein controlling the propagation delay comprises setting the delay control bits based on the frequency control word.

8. The method of claim 1, further comprising:
adjusting a sensitivity of the oscillator circuit to the droopy supply voltage.

9. A method comprising:
generating, based on a regulated supply voltage and an output clock signal, a regulated supply signal at a first delay line of an oscillator circuit;
generating, based on a droopy supply voltage and the output clock signal, a droopy supply signal at a second delay line of the oscillator circuit, wherein the second delay line has a same number and type of components as the first delay line;
controlling a propagation delay of at least one of the regulated supply signal and the droopy supply signal based on a comparison between a number of reference clock cycles counted within a specified period and a number of clock cycles of the output clock signal counted within the specified period; and
based on the output clock signal, sending the regulated supply signal from the first delay line and the droopy supply signal from the second delay line to an edge detector of the oscillator circuit, wherein:
the edge detector is configured to generate the output clock signal; and
an oscillation frequency of the output clock signal is based on a relationship between the regulated supply signal and the droopy supply signal.

10. The method of claim 9, wherein at least one of the first delay line and the second delay line includes a plurality of programmable buffers.

11. The method of claim 9, further comprising:
generating, at a voltage regulator, the regulated supply voltage comprising sending the droopy supply voltage through a low-pass filter.

12. The method of claim 9, further comprising:
driving a clock tree of a system-on-chip comprising sending the output clock signal to the clock tree.

13. The method of claim 12, further comprising:
based on the output clock signal, generating a plurality of output clock signals that are multiphase and are in a fixed timing relationship to each other.

14. The method of claim 12, further comprising:
generating, at a plurality of stages of the clock tree, a plurality of respective clocks having different respective phases, wherein each stage of the plurality of stages is driven by a different respective oscillator circuit.

15. The method of claim 9, wherein the relationship between the regulated supply signal and the droopy supply signal is based on a polarity of the regulated supply signal being the same as a polarity of the droopy supply signal.

16. The method of claim 9, further comprising:
in response to the droopy supply voltage undershooting the regulated supply voltage, stretching a period of the output clock signal based on the droopy supply voltage.

17. The method of claim 9, further comprising:
in response to the droopy supply voltage overshooting the regulated supply voltage, clamping the output clock signal based on the regulated supply voltage.

18. The method of claim 9, wherein controlling the propagation delay comprises:
inputting first delay control bits to the first delay line and second delay control bits to the second delay line to control the propagation delay of the at least one of the regulated supply signal and the droopy supply signal.

19. The method of claim 18, further comprising:
adjusting the first delay control bits based on an output clock overshoot threshold.

20. The method of claim 18, further comprising:
adjusting the second delay control bits based on an output clock overshoot threshold.

* * * * *